(12) United States Patent
Thomsen et al.

(10) Patent No.: US 7,267,879 B2
(45) Date of Patent: Sep. 11, 2007

(54) COATED ARTICLE WITH SILICON OXYNITRIDE ADJACENT GLASS

(75) Inventors: Scott V. Thomsen, Milford, MI (US); Anton Dietrich, Fontnas (CH); Jose Nunez Regueiro, Fairport, NY (US)

(73) Assignees: Guardian Industries Corp., Auburn Hills, MI (US); Centre Luxembourgeois de Recherches pour le Verre et la Ceramique S.A. (C.R.V.C.), Grand Duche de Luxembourg (LU)

( * ) Notice: Subject to any disclaimer, the term of this patent is extended or adjusted under 35 U.S.C. 154(b) by 338 days.

(21) Appl. No.: 10/636,918

(22) Filed: Aug. 8, 2003

(65) Prior Publication Data

US 2004/0086723 A1    May 6, 2004

Related U.S. Application Data

(60) Continuation-in-part of application No. 10/337,383, filed on Jan. 7, 2003, now Pat. No. 6,723,211, and a continuation-in-part of application No. 10/337,384, filed on Jan. 7, 2003, now Pat. No. 6,686,050, which is a division of application No. 09/794,224, filed on Feb. 28, 2001, now Pat. No. 6,576,349, application No. 10/636,918, which is a continuation-in-part of application No. 10/400,080, filed on Mar. 27, 2003.

(51) Int. Cl.
*B32B 17/06* (2006.01)

(52) U.S. Cl. ............ 428/428; 428/432; 428/697; 428/698; 428/699; 428/701; 428/702

(58) Field of Classification Search ......... 428/216, 428/336, 428, 432, 433, 697, 698, 699, 701, 428/702; 359/350, 360, 359, 585, 580, 584
See application file for complete search history.

(56) References Cited

U.S. PATENT DOCUMENTS

| 3,682,528 A | 8/1972 | Apfel et al. |
| 4,786,783 A | 11/1988 | Woodard |
| 4,898,790 A | 2/1990 | Finley |
| 5,298,048 A | 3/1994 | Lingle et al. |
| 5,376,455 A | 12/1994 | Hartig et al. |

(Continued)

OTHER PUBLICATIONS

U.S. Appl. No. 10/337,383, filed Jan. 7, 2003.
U.S. Appl. No. 10/337,384, filed Jan. 7, 2003.
U.S. Appl. No. 10/400,080, filed Mar. 27, 2003.

*Primary Examiner*—Jennifer McNeil
*Assistant Examiner*—G. Blackwell
(74) *Attorney, Agent, or Firm*—Nixon & Vanderhye P.C.

(57) ABSTRACT

A low-E coated article is provided, in certain example embodiments, with a layer including silicon oxynitride adjacent the glass substrate in order to improve chemical and/or mechanical durability of the coated article. In certain example embodiments, the coated article may be formed so as to have a fairly high visible transmission (TY or $T_{vis}$) to sheet resistance ($R_s$) ratio (i.e., a ratio $T_{vis}/R_s$). The higher this ratio, the better the coated article's combined functionality of providing for both good solar performance (e.g., ability to reflect and/or absorb IR radiation) and high visible transmission. Coated articles herein may be used in the context of insulating glass (IG) window units, architectural or residential monolithic window units, vehicle window units, and/or the like.

29 Claims, 4 Drawing Sheets

U.S. PATENT DOCUMENTS

| | | |
|---|---|---|
| 5,425,861 A | 6/1995 | Hartig et al. |
| 5,557,462 A | 9/1996 | Hartig et al. |
| 5,563,734 A | 10/1996 | Wolfe et al. |
| 5,688,585 A | 11/1997 | Lingle et al. |
| 5,800,933 A | 9/1998 | Hartig et al. |
| 5,821,001 A | 10/1998 | Arbab et al. |
| 5,935,702 A * | 8/1999 | Macquart et al. ............ 428/336 |
| 6,014,872 A | 1/2000 | Hartig et al. |
| 6,045,896 A | 4/2000 | Boire et al. |
| 6,060,178 A | 5/2000 | Krisko |
| 6,132,881 A | 10/2000 | Hartig et al. |
| 6,159,607 A | 12/2000 | Hartig et al. |
| 6,322,881 B1 * | 11/2001 | Boire et al. .................. 428/216 |
| 6,398,925 B1 | 6/2002 | Arbab et al. |
| 6,432,545 B1 | 8/2002 | Schicht et al. |
| 6,445,503 B1 | 9/2002 | Lingle |
| 6,447,891 B1 * | 9/2002 | Veerasamy et al. ......... 428/216 |
| 6,475,626 B1 | 11/2002 | Stachowiak |
| 6,495,251 B1 | 12/2002 | Arbab et al. |
| 6,495,263 B2 | 12/2002 | Stachowiak |
| 6,524,688 B1 | 2/2003 | Eby et al. |
| 6,576,349 B2 | 6/2003 | Lingle et al. |
| 6,625,875 B2 * | 9/2003 | Sol ............................ 29/621 |
| 6,686,050 B2 | 2/2004 | Lingle et al. |
| 6,723,211 B2 | 4/2004 | Lingle et al. |
| 2001/0041252 A1 | 11/2001 | Laird |
| 2002/0031674 A1 | 3/2002 | Laird |
| 2002/0192474 A1 | 12/2002 | Lingle |
| 2003/0104221 A1 | 6/2003 | Stachowiak |
| 2003/0215622 A1 * | 11/2003 | MacQuart et al. .......... 428/216 |
| 2006/0054492 A1 * | 3/2006 | Stachowiak .............. 204/192.2 |

* cited by examiner

COATED ARTICLE WITH SILICON OXYNITRIDE ADJACENT GLASS

PRIORITY CLAIM AND CROSS-REFERENCE TO RELATED APPLICATIONS

This application is a continuation-in-part (CIP) of each of U.S. patent application Ser. Nos. 10/337,383 now U.S. Pat. No. 6,723,211 and 10/337,384, now U.S. Pat. No. 6,686,050 both filed Jan. 7, 2003, which are each divisions of 09/794,224, filed Feb. 28, 2001, U.S. Pat. No. 6,576,349 the disclosures of which are all hereby incorporated herein by reference. This application is also a CIP of, and claims priority on, U.S. patent application Ser. No. 10/400,080, filed Mar. 27, 2003 the disclosure of which is hereby incorporated herein by reference. Priority is hereby claimed on all of the aforesaid applications.

BACKGROUND OF THE INVENTION

Windows including glass substrates with solar control coatings provided thereon are known in the art. Such windows may be used in the context of architectural windows, insulating glass (IG) window units, automotive windows, and/or the like.

Related U.S. patent application Ser. No. 10/400,080 (not prior art) discloses a coated article having the following layer stack where the layers are listed in order from the glass substrate outwardly:

TABLE 1

(Example Materials/Thicknesses; 10/400,080)

| Layer | Preferred Range (Å) | More Preferred (Å) | Example (Å) |
|---|---|---|---|
| $TiO_x$ | 20-400 Å | 20-60 Å | 40 Å |
| $Si_xN_y$ | 50-450 Å | 90-200 Å | 113 Å |
| $ZnO_x$ | 10-300 Å | 40-150 Å | 100 Å |
| Ag | 50-250 Å | 80-120 Å | 95 Å |
| $NiCrO_x$ | 10-100 Å | 15-35 Å | 26 Å |
| $SnO_2$ | 0-1,000 Å | 350-800 Å | 483 Å |
| $Si_xN_y$ | 50-450 Å | 90-200 Å | 113 Å |
| $ZnO_x$ | 10-300 Å | 40-150 Å | 100 Å |
| Ag | 50-250 Å | 80-220 Å | 131 Å |
| $NiCrO_x$ | 10-100 Å | 15-35 Å | 26 Å |
| $SnO_2$ | 0-750 Å | 70-200 Å | 100 Å |
| $Si_3N_4$ | 0-750 Å | 120-320 Å | 226 Å |

While the aforesaid coated article of Ser. No. 10/400,080 is excellent in most respects, there is always room for improvement. For example, it would certainly be desirable if durability could be improved.

Turning to another separate and distinct issue, it is known that if one wants to improve a coating's solar performance (e.g., infrared reflection), the thickness of the silver layer(s) can be increased in order to decrease the coating's sheet resistance. Thus, if one wants to improve a coating's solar performance by increasing its ability to reflect infrared (IR) rays or the like, one typically would increase the thickness of the IR blocking (or reflecting) silver layer(s). Unfortunately, increasing the thickness of the silver layer(s) causes visible transmission (TY or $T_{vis}$) to drop. Accordingly, in the past, when one sought to improve the solar performance of a coating in such a manner, it was at the expense of visible transmission. In other words, when solar performance was improved, visible transmission was sacrificed and decreased. Stated another way, it has been difficult to increase the ratio of visible transmission to sheet resistance (i.e., $T_{vis}/R_s$) especially if heat treatability and/or durability are to be provided. This is why many coatings that block (reflect and/or absorb) much IR radiation have rather low visible transmission.

An excellent way to characterize a coated article's ability to both allow high visible transmission and achieve good solar performance (e.g., IR reflection and/or absorption) is the coating's $T_{vis}/R_s$ ratio. The higher the $T_{vis}/R_s$ ratio, the better the combination of the coating's ability to both provide high visible transmission and achieve good solar performance.

For example only, Example 1 in U.S. Published Patent Application No. 2002/0192474 is characterized by a ratio of visible transmission to sheet resistance (i.e., $T_{vis}/R_s$) of 16.1 before HT, and 27.4 after HT, measured monolithically. As another example, in U.S. Pat. No. 5,821,001 to Arbab, single silver Example 1 has a ratio $T_{vis}/R_s$ of 10.7 before HT, and 19.5 after HT. Double silver Example 2 of the '001 patent has a ratio $T_{vis}/R_s$ of 14.4 before HT, and 22.1 after HT. As another example, the non-heat treatable version of Example 1 of U.S. Pat. No. 6,432,545 to Schicht relates to a single silver layer stack (not a double silver stack) having a ratio $T_{vis}/R_s$ of 19.8 with no HT. The heat treatable version of Example 1 of U.S. Pat. No. 6,432,545 (which has a pre-HT $T_{vis}$ of 70%) also relates to a single silver layer stack, but has a ratio $T_{vis}/R_s$ of 16.7 before HT, and 28.8 after HT.

It can be seen from the above that commercially acceptable conventional heat treatable coatings cannot achieve very high $T_{vis}/R_s$ ratios, thereby illustrating that their combined characteristic of visible transmission relative to sheet resistance (and solar performance) can be improved. In the past, it has been theoretically possible to increase the $T_{vis}/R_s$ ratio, but not in a commercially acceptable manner. For example, U.S. Pat. No. 4,786,783 alleges that a coated article therein has a rather high $T_{vis}/R_s$ ratio (the 76.4% visible transmission alleged in this patent is suspect to some extent in view of the very thick silver layers in Example 2). However, even if one were to believe the data in the '783 patent, the coated articles therein are not commercially acceptable. For example, Example 2 of the '783 patent can only achieve the alleged visible transmission of 76.4% by not including sufficient protective dielectric layer(s) or silver protecting layer(s). For example, Example 2 of the '783 patent has, inter alia, no protective contact layers (e.g., Ni, NiCr, Cr, $NiCrO_x$, ZnO, Nb, or the like) between the bottom titanium oxide layer and silver layer to protect the silver during HT (protective contact layers reduce visible transmission, but protect the silver during HT). In other words, Example 2 of U.S. Pat. No. 4,786,783 could not survive heat treatment (e.g., heat bending, tempering, and/or heat strengthening) in a commercially acceptable manner. If Example 2 of the '783 patent was heat treated, the sheet resistance would effectively disappear because the silver layer(s) would heavily oxidize and be essentially destroyed, thereby leading to unacceptable optical properties such as massive (very high) haze, very large $\Delta E^*$ values, and unacceptable coloration. For example, because Example 2 of the '783 patent does not use sufficient layer(s) to protect the silver during HT, the coated article would have very high $\Delta E^*$ values (glass side reflective and transmissive) due to heat treatment; $\Delta E^*$ over 10.0 and likely approaching 20.0 or more (for a detailed discussion on the meaning of $\Delta E^*$, see U.S. Pat. Nos. 6,495,263 and/or 6,475,626, both of which are hereby incorporated herein by reference). Clearly, this is not a commercially acceptable heat treatable product.

Thus, in certain instances, it may be desirable to improve durability of coatings such as the aforesaid coating of Ser. No. 10/400,080. Additionally, but not with respect to Ser.

No. 10/400,080, it may be desirable in certain situations to (a) increase visible transmission without sacrificing solar performance, (b) improve solar performance without sacrificing visible transmission, and/or (c) improve both solar performance and visible transmission. In other words, it may in certain situations be desirable for the $T_{vis}/R_s$ ratio to be increased in a coating that may be heat treated in a commercially acceptable manner. For example, it may be desirable to achieve (a), (b) and/or (c) while simultaneously being able to keep the $\Delta E^*$ value (glass side reflective and/or transmissive) due to HT below 8.0 or the like.

BRIEF SUMMARY OF EXAMPLE EMBODIMENTS OF THE INVENTION

In certain example embodiments of this invention, it has surprisingly been found that by adding a layer comprising silicon oxynitride adjacent the glass surface to the aforesaid coated article of Ser. No. 10/400,080, and/or to other suitable coated articles, mechanical durability can be significantly improved. In certain example embodiments, the silicon oxynitride may have an index of refraction (n) of from 1.55 to 2.0, more preferably from 1.60 to 1.70. However, in laminated embodiments such as vehicle windshields, the silicon oxynitride may have an index of refraction (n) of from 1.85 to 2.0, more preferably from 1.90 to 2.0, in order to reduce transmission losses due to lamination. For unknown reasons, such a layer results in significant durability improvement of the resulting coated article. The coated article may be heat treated in certain instances.

In other example embodiments of this invention, there is provided a heat treatable coated article having a visible transmission (TY or $T_{vis}$) to sheet resistance ($R_s$) ratio (i.e., a ratio $T_{vis}/R_s$) of at least 30 after heat treatment (HT), more preferably of at least 32 after HT, even more preferably of at least 34 after HT, and most preferably of at least 36 after HT. In certain example embodiments, the coated article is heat treatable in a commercially acceptable manner in that: (i) its $\Delta E^*$ value (glass side reflective and/or transmissive) due to HT is no greater than about 8.0, more preferably no greater than about 5.0, even more preferably no greater than about 4.0, even more preferably no greater than about 3.0, and sometimes no greater than 2.5; and/or (ii) the coating includes at least one metal inclusive contact layer (e.g., Ni, NiCr, Cr, Ti, TiO, $NiCrO_x$, ZnO, ZnAlO, Nb, mixtures thereof, or the like) between an IR reflecting layer (e.g., silver layer) and a dielectric layer so as to protect the IR reflecting layer during HT.

In certain example embodiments, coated articles (monolithic and/or IG units) herein may have a SHGC (e.g., surface #2 of an IG unit) of no greater than 0.45 (more preferably no greater than 0.41, and most preferably no greater than 0.40), and/or a TS % of no greater than 40% (more preferably no greater than 36%, and most preferably no greater than 34%).

In certain example embodiments of this invention, there is provided a coated article including a multi-layer coating supported by a glass substrate, the multi-layer coating comprising, from the glass substrate outwardly: a layer comprising silicon oxynitride located directly on and contacting the glass substrate; a layer comprising titanium oxide located directly on and contacting the layer comprising silicon oxynitride; a layer comprising zinc oxide located over the layers comprising silicon oxynitride and titanium oxide; a layer comprising silver located over and contacting the layer comprising zinc oxide; a dielectric layer comprising a metal oxide; another layer comprising silver; and another dielectric layer.

In other example embodiments of this invention there is provided a coated article including a multi-layer coating supported by a glass substrate, the multi-layer coating comprising, from the glass substrate outwardly: a layer comprising silicon oxynitride located directly on and contacting the glass substrate; a layer comprising a metal oxide located directly on and contacting the layer comprising silicon oxynitride; a contact layer; a layer comprising silver located over and contacting the contact layer; a dielectric layer comprising a metal oxide; another contact layer; another layer comprising silver provided over and contacting said another contact layer; and at least one further dielectric layer.

In still further example embodiments of this invention, there is provided a heat treated coated article comprising: a glass substrate; a layer comprising silicon oxynitride on said substrate; at least first and second layers comprising silver on said substrate located over said layer comprising silicon oxynitride; and wherein the heat treated coated article has a ratio $T_{vis}/R_s$ of at least 30 after heat treatment (where $T_{vis}$ is visible transmission (%) and $R_s$ is sheet resistance of the coating in units of ohms/square) and a $\Delta E^*$ value (glass side reflective and/or transmissive) of less than or equal to about 8 due to the heat treatment.

DETAILED DESCRIPTION OF EXAMPLE EMBODIMENTS OF THE INVENTION

Figure 1:
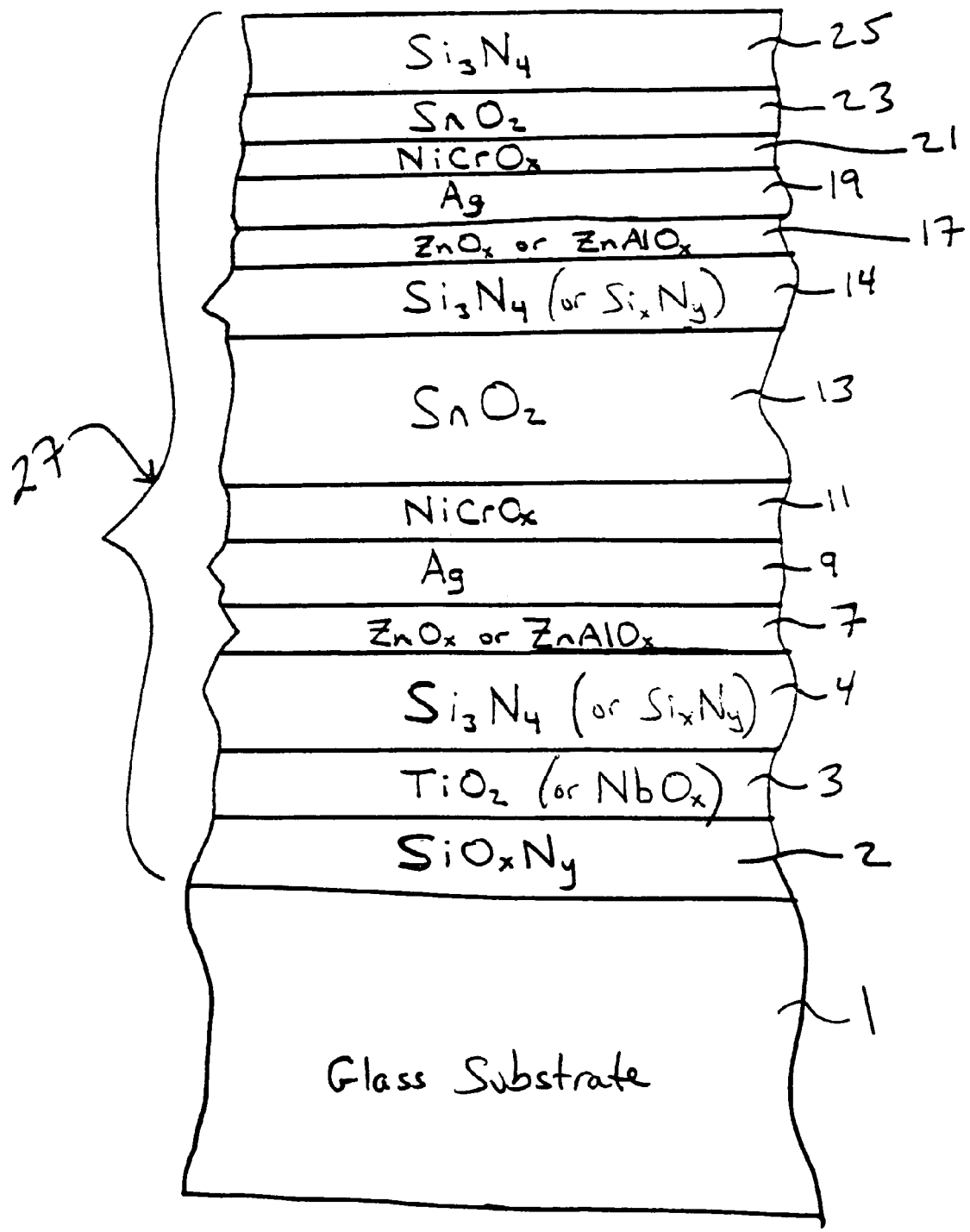
FIG. 1 is a cross sectional view of a monolithic coated article according to an example embodiment of this invention.

Referring now more particularly to the accompanying drawings in which like reference numerals indicate like parts throughout the several views.

In certain example embodiments of this invention, a layer comprising silicon oxynitride is provided adjacent the glass surface. Unexpectedly, it has been found that this permits significantly improved durability to be achieved in connection with certain types of coated articles which may or may not be heat treated. In certain example embodiments, the silicon oxynitride may be doped with aluminum (e.g., 0-10%), stainless steel, or the like.

In other example embodiments of this invention, coated articles may be provided so as to have a fairly high visible transmission (TY or $T_{vis}$) to sheet resistance ($R_s$) ratio (i.e., a ratio $T_{vis}/R_s$) The higher this ratio, the better the coated article's combined functionality of providing for both good solar performance (e.g., ability to reflect and/or absorb IR radiation) and high visible transmission. In certain example embodiments, coated articles herein may also be characterized by fairly neutral color (transmissive and/or glass side reflective).

Coated articles herein may be used in the context of insulating glass (IG) window units, architectural window units, residential window units (e.g., IG and/or monolithic), vehicle window units such as laminated windshields, back-lites, or sidelites, and/or other suitable applications.

Coated articles herein may have one or more infrared (IR) reflecting layers, which typically comprise or consist essentially of silver (Ag), gold (Au), or the like. Thus, this invention relates to double silver stacks (preferably), but also relates to single silver stacks, and other types of stacks encompassed by one or more claims.

In certain example embodiments of this invention, a coated article is provided so as to have: (a) a bottom layer of or including silicon oxynitride adjacent the glass surface to improve chemical and/or mechanical durability; (b) a visible transmission to sheet resistance ratio (i.e., a ratio $T_{vis}/R_s$) of at least 25 after heat treatment (HT), more preferably of at least 30 after HT, still more preferably of at least 32 after HT, even more preferably of at least 34 after HT, and most preferably of at least 36 after HT; and/or (c) a ratio $T_{vis}/R_s$ of at 20 before HT, more preferably of at least 22 before HT, even more preferably of at least 25 before HT, and most preferably of at least 28 before HT (coated articles herein may or may not be heat treated in different embodiments). In certain example embodiments, coated articles are heat treatable in a commercially acceptable manner in that: (i) coated articles may have a $\Delta E^*$ value (glass side reflective and/or transmissive) due to HT is no greater than about 8.0, more preferably no greater than about 5.0, even more preferably no greater than about 4.0, even more preferably no greater than about 3.0, and sometimes no greater than about 2.5; and/or (ii) coatings may include at least one metal inclusive contact layer (e.g., Ni, NiCr, Cr, Ti, TiO, $NiCrO_x$, ZnO, ZnAlO, Nb, mixtures thereof, or any other suitable material) between a silver layer and a dielectric layer so as to protect the IR reflecting layer(s) (e.g., silver or the like) such as during HT or other processing.

Factors which may contribute to the surprisingly high $T_{vis}/R_s$ ratios herein include one or more of: example layer stack portions described herein, example layer stoichiometries herein, example layer thicknesses herein, the use of a Si-rich silicon nitride inclusive layer under at least one IR reflecting layer herein, and/or the deposition of different zinc oxide inclusive layers at different oxygen partial pressures.

For example, in certain example embodiments, it has surprisingly been found that the use of a combination of a Si-rich silicon nitride inclusive layer and a zinc oxide inclusive layer (e.g., ZnO, $ZnAlO_x$, or ZnO containing other element(s)) under a layer comprising silver allows the silver be deposited (e.g., via sputtering or the like) in a manner which causes its sheet resistance to be lessened compared to if other material(s) were under the silver. In certain example embodiments, a surprising finding is that the Si-rich silicon nitride inclusive ($Si_xN_y$) layer(s) allows the ratio $T_{vis}/R_s$ to be increased significantly after HT (e.g., heat strengthening, thermal tempering, and/or heat bending). While it is not certain why this Si-rich layer $Si_xN_y$ works in such a manner, it is believed that the presence of free Si in the Si-rich silicon nitride inclusive layer may allow many atoms such as sodium (Na) which migrate outwardly from the glass during HT to be stopped by the Si-rich silicon nitride inclusive layer before they can reach the silver and damage the same. Thus, it is believed that the oxidation caused by heat treatment allows visible transmission to increase, and that the Si-rich $Si_xN_y$ layer(s) reduces the amount of damage done to the silver layer(s) during HT thereby allowing sheet resistance ($R_s$) to decrease in a desirable manner.

As another example, in certain example embodiments, it has surprisingly been found that by depositing upper and lower zinc oxide inclusive contact layers using different partial pressures (e.g., oxygen partial pressure), the sheet resistance of the coating can be decreased before and/or after HT thereby providing for improved solar performance. In certain example embodiments, the sheet resistance of the coating (taking the sheet resistance(s) of all silver inclusive or other IR reflecting layer(s) into account) can be reduced when the zinc oxide inclusive contact layer for the upper IR reflecting layer (e.g., silver) is sputter deposited at a lower gas partial pressure than the zinc oxide inclusive contact layer for the lower IR reflecting layer.

Another surprising result associated with certain example embodiments of this invention is that neutral coloration can be provided (transmissive and/or glass side reflective).

FIG. 1 is a side cross sectional view of a coated article according to an example non-limiting embodiment of this invention. The coated article includes substrate 1 (e.g., clear, green, bronze, or blue-green glass substrate from about 1.0 to 10.0 mm thick, more preferably from about 1.0 mm to 3.5 mm thick), and coating (or layer system) 27 provided on the substrate 1 either directly or indirectly. The coating (or layer system) 27 may include: dielectric silicon oxynitride layer 2 (which may or may not be doped with Al, stainless steel, or the like), dielectric titanium and/or niobium oxide layer 3, dielectric silicon nitride layer 4 which may be $Si_3N_4$, or a Si-rich type (which may or may not be doped with Al, stainless steel, or the like), first lower contact layer 7 which contacts and protects IR reflecting layer 9, first conductive and potentially metallic infrared (IR) reflecting layer 9, first upper contact layer 11 which contacts and protects IR reflecting layer 9, dielectric layer 13, another silicon nitride inclusive layer 14 (stoichiometric type or Si-rich type), second lower contact layer 17 which contacts and protects IR reflecting layer 19, second upper contact layer 21 which contacts and protects upper IR reflecting layer 19, dielectric layer 23, and finally protective dielectric layer 25. The "contact" layers 7, 11, 17 and 21 each contact at least one IR reflecting layer (e.g., Ag layer). The aforesaid layers 2-25 make up low-E (i.e., low emissivity) coating 27 which is provided on glass or plastic substrate 1.

Compared to the aforesaid coated article of Ser. No. 10/400,080, it has unexpectedly been found that the addition of silicon oxynitride layer 2 allows mechanical and/or chemical durability of the coated article to be significantly improved—especially after heat treatment). Silicon oxynitride 2 can have a variety of different indices of refraction "n"—e.g., from about 1.5 to 2.0. In certain preferred embodiments of this invention, it has been found that the use of a silicon oxynitride layer 2 having an index of refraction "n" from 1.55 to 2.0. In certain example instances, layer 2 may have an index "n" of at least 1.6. In embodiments such as IG window units or other non-laminated embodiments, the layer 2 may have an index "n" of from 1.55 to 1.75, more preferably from 1.60 to 1.70. Such indices "n" are particularly beneficial for achieving a coated article with desired optical characteristics (e.g., small reflection, desirable color, and/or the like). For laminated parts such as laminated vehicle windshields, the silicon oxynitride 2 may preferably have in certain example embodiments an index of refraction "n" of from 1.85 to 2.0, more preferably from 1.9 to 2.0 in order to avoid transmission losses due to lamination (due to the different refractive index of the material contacting the film surface such as PVB at 1.57 instead of air at 1.0, the higher index at both boundary surfaces can reduce reflection losses; in such cases even under-stoichiometric silicon nitride may be used). Silicon nitride may transform to silicon oxynitride during heat treatment to some extend by absorbing water residue from the glass surface from the preceding process (thus, the layer 2 before heat treatment may be either silicon nitride or silicon oxynitride). Yet another possible advantage of silicon oxynitride layer 2 is its ability to reduce migration of Na and the like from the glass into the bulk of the coating during heat treatment. Additionally, it has surprisingly been found that the provision of silicon oxynitride layer 2 allows input glass storage time to be increased in certain instances (e.g., from 2 weeks to 6 weeks).

Furthermore, the layer 2 comprising silicon oxynitride preferably has a "k" value (550 nm) of no greater than about 0.04, more preferably no greater than about 0.03. In certain example embodiments, the "k" value of the layer 2 is from 0.01 to 0.03, most preferably about 0.02.

Moreover, it is believed that the presence of silicon oxynitride layer 2 may help reduce and/or eliminate a reflective color "bump" between 400 and 500 nm, thereby leading to a more neutral reflected color in certain example instances.

In certain preferred embodiments of this invention, the thickness of titanium oxide (or niobium oxide) layer 3 is from 20 to 60 Å, more preferably from 30 to 60 Å, and even more preferably from 40 to 50 Å. This layer is optional in certain embodiments, and may be of different materials.

Infrared (IR) reflecting layers 9 and 19 are preferably metallic and/or conductive, and may comprise or consist essentially of silver (Ag), gold, or any other suitable IR reflecting material. These IR reflecting layers help allow coating 27 to have low-E and/or good solar control characteristics. The IR reflecting layer(s) may be slightly oxidized in certain embodiments of this invention.

The upper contact layers 11 and 21 may be of or include nickel (Ni) oxide, chromium/chrome (Cr) oxide, or a nickel alloy oxide such as nickel chrome oxide ($NiCrO_x$), or other suitable material(s), in certain example embodiments of this invention. The use of, for example, $NiCrO_x$ for/in these layers allows durability to be improved. The $NiCrO_x$ layers may be fully oxidized in certain embodiments of this invention (i.e., fully stoichiometric), or may be at least about 50% oxidized in other embodiments of this invention. In certain preferred embodiments, the $NiCrO_x$ for/in these layer(s) may be slightly under-stoichiometric (oxygen deficient). While $NiCrO_x$ is a preferred material for these contact layers, those skilled in the art will recognize that other materials may instead be used. Contact layers 11 and/or 21 (e.g., of or including $NiCrO_x$) may or may not be oxidation graded in different embodiments of this invention. Oxidation grading means that the degree of oxidation in the layer(s) changes throughout the thickness of the layer(s) so that for example a contact layer may be graded so as to be less oxidized at the contact interface with the immediately adjacent IR reflecting layer than at a portion of the contact layer(s) further or more/most distant from the immediately adjacent IR reflecting layer. Descriptions of various types of oxidation graded contact layers 11 and 21 are set forth in U.S. Pat. No. 6,576,349, the disclosure of which is hereby incorporated herein by reference.

Lower contact layers 7 and 17 may comprise zinc oxide (e.g., ZnO) in certain example embodiments of this invention. The zinc oxide may contain Al (e.g., to form ZnAlO) or other element(s) in certain example embodiments. In certain alternative embodiments of this invention, another layer (e.g., an oxide of NiCr, an oxide of Ni, or the like) may be provided between the zinc oxide inclusive layer 7 (or 17) and the nearest IR reflecting layer 9 (or 19).

Silicon nitride inclusive dielectric layer(s) 4 and/or 14 is/are provided so as to, among other things, improve heat-treatability of the coated articles, e.g., such as thermal tempering or the like. Moreover, as explained above, in certain example embodiments, it has surprisingly been found that the use of a combination of a Si-rich silicon nitride inclusive layer (4 and/or 14) and a zinc oxide inclusive layer (e.g., ZnO or $ZnAlO_x$) (7 and/or 17) under a layer comprising silver (9 and/or 19) allows the silver to be deposited (e.g., via sputtering or the like) in a manner which causes its sheet resistance to be lessened compared to if certain other material(s) were under the silver. In certain example embodiments, a surprising finding is that the Si-rich silicon nitride inclusive ($Si_xN_y$) layer(s) allows the ratio $T_{vis}/R_s$ to be increased significantly after HT (e.g., heat strengthening, thermal tempering, and/or heat bending). It is believed that the presence of free Si in the Si-rich silicon nitride inclusive layer(s) (4 and/or 14) may allow certain atoms such as sodium (Na) which migrate outwardly from the glass 1 during HT to be stopped by the Si-rich silicon nitride inclusive layer before they can reach the silver and damage the same. Thus, it is believed that the oxidation caused by heat treatment allows visible transmission to increase, and that the Si-rich $Si_xN_y$ layer(s) reduces the amount of damage done to the silver layer(s) during HT thereby allowing sheet resistance ($R_s$) to decrease in a satisfactory manner. Additionally, it is noted that in certain example embodiments of this invention, layer 4 may be of or include silicon oxynitride.

Each of the aforesaid silicon inclusive layers 2, 4 and 14 may of course be doped with materials such as Al and/or B (e.g., from 0 to 15%, more preferably from 1 to 12%).

In certain example embodiments, one or both of the potentially Si-rich silicon nitride layers 4 and/or 14 may be characterized by $Si_xN_y$ layer(s), where x/y may be from 0.76 to 1.5, more preferably from 0.8 to 1.4, still more preferably from 0.80 to 1.0. Higher x/y ratios may cause haze levels to increase undesirably. Moreover, in certain example embodiments, before and/or after HT the Si-rich $Si_xN_y$ layer(s) (4 and/or 14) may have an index of refraction "n" of at least 2.05, more preferably of at least 2.07, even more preferably at least 2.10, and most preferably from about 2.15 to 2.25 (e.g., about 2.20) (e.g., 632 nm) (note: stoichiometric $Si_3N_4$ has an index "n" of 2.04). Layers with an index below about 2.10 are typically already saturated with nitrogen, which may not be desirable in heat treatable embodiments. Also, the Si-rich $Si_xN_y$ layer(s) (4 and/or 14) in certain example embodiments may have an extinction coefficient "k" of at least 0.001, more preferably of at least 0.003 (note: stoichiometric $Si_3N_4$ has an extinction coefficient "k" of effectively 0). In certain preferred embodiments, the Si-rich $Si_xN_y$ layer(s) 4 and/or 14 has an extinction coefficient "k" of from about 0.01 to 0.02.

Dielectric layer 13 acts as a coupling layer between the two halves of the coating 27, and is of or includes tin oxide in certain embodiments of this invention. However, other dielectric materials may instead be used for layer 13.

Dielectric layers 23 and 25 may allow the environmental resistance of the coating 27 to be improved, and are also provided for color purposes. In certain example embodiments, dielectric layer 23 may be of or include tin oxide (e.g., $SnO_2$), although other materials may instead be used. Dielectric overcoat layer 25 may be of or include silicon nitride (e.g., $Si_3N_4$) in certain embodiments of this invention, although other materials may instead be used such as titanium dioxide, silicon oxynitride, tin oxide, zinc oxide, niobium oxide, or the like such as dielectrics with an index of refraction "n" from 1.6 to 3.0. Layer 23 (and/or other layers in FIG. 1) may be omitted in certain example embodiments of this invention.

Other layer(s) may also be provided. Thus, while the layer system or coating 27 is "on" or "supported by" substrate 1 (directly or indirectly), other layer(s) may be provided therebetween. Thus, for example, coating 27 of FIG. 1 may be considered "on" and "supported by" the substrate 1 even if other layer(s) are provided between layer 3 and substrate 1. Moreover, certain layers of coating 27 may be removed in certain embodiments, while others may be added between the various layers or the various layer(s) may be split with other layer(s) added between the split sections in other embodiments of this invention without departing from the overall spirit of certain embodiments of this invention.

Figure 2:
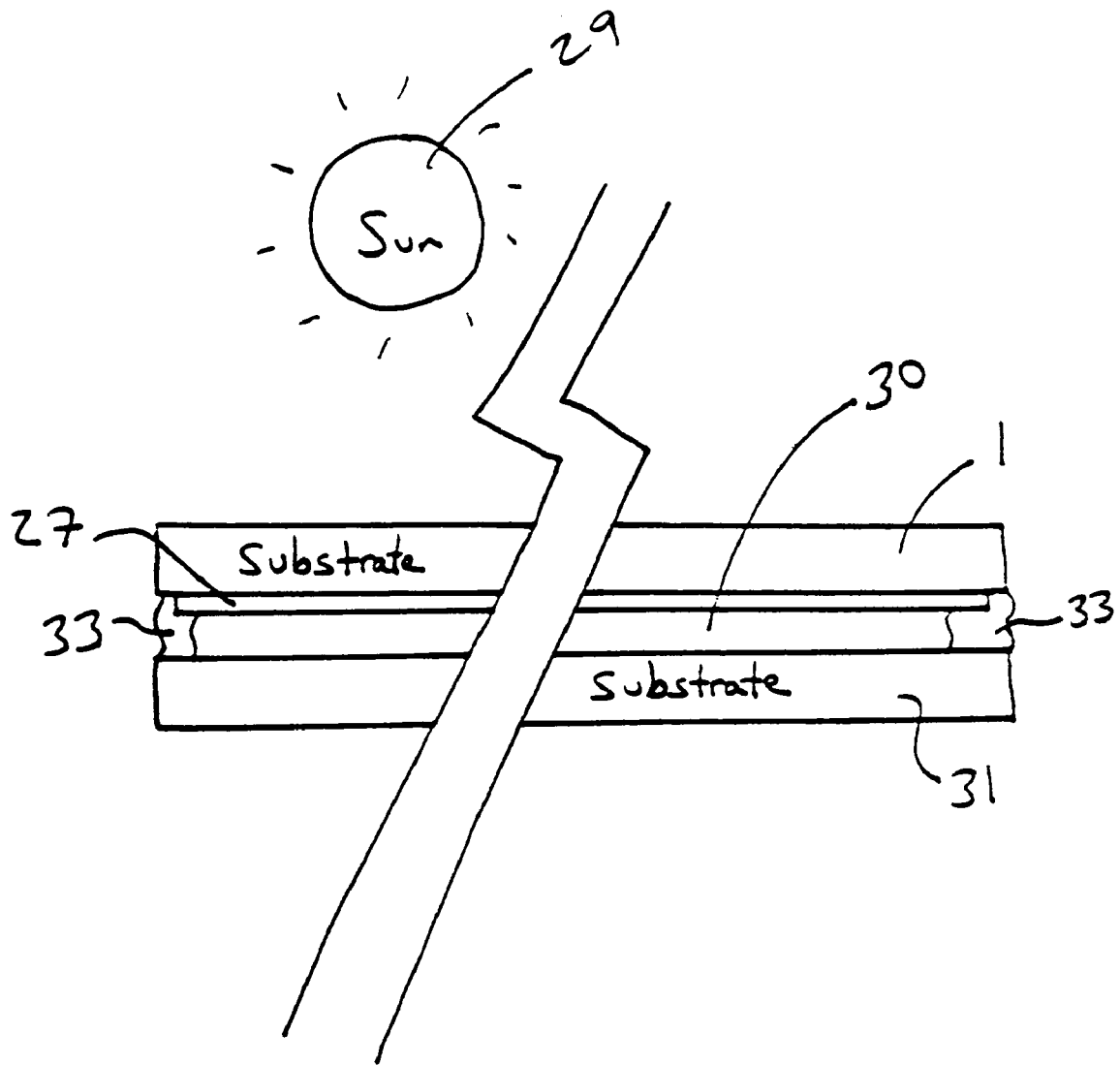
FIG. 2 is a cross sectional view of the coated article of FIG. 1 being used in an IG window unit according to an example embodiment of this invention.

FIG. 2 illustrates the coating or layer system 27 being utilized on surface #2 of an IG window unit. Coatings 27 according to any embodiment herein may be used in IG units as shown in FIG. 2. In order to differentiate the "inside" of the IG unit from its "outside", the sun 29 is schematically presented on the outside. The IG unit includes outside glass pane or sheet (i.e., substrate 1 from FIG. 1) and inside glass pane or sheet 31. These two glass substrates (e.g. float glass 1-10 mm thick) are sealed at their peripheral edges by a conventional sealant and/or spacer 33 and may be provided with a conventional desiccant strip (not shown). The panes may then be retained in a conventional window or door retaining frame. By sealing the peripheral edges of the glass sheets and optionally replacing the air in insulating space (or chamber) 30 with a gas such as argon, a typical, high insulating value IG unit is formed. Optionally, insulating space 30 may be at a pressure less than atmospheric pressure in certain alternative embodiments (with or without a gas in space 30), although this of course is not necessary in all embodiments. While the inner side of substrate 1 is provided with coating 27 in FIG. 2, this invention is not so limited (e.g., coating 27 may instead be provided on the interior surface of substrate 31 in other embodiments of this invention).

Turning back to FIG. 1, while various thicknesses may be used in different embodiments of this invention, example thicknesses and materials for the respective layers on the glass substrate 1 in the FIG. 1 embodiment are as follows, from the glass substrate outwardly:

TABLE 2

(Example Materials/Thicknesses; FIG. 1 Embodiment)

| Layer | Preferred Range (Å) | More Preferred (Å) | Example (Å) |
|---|---|---|---|
| $SiO_xN_y$ (layer 2) | 10-300 Å | 40-200 Å | 100-120 Å |
| $TiO_x$ (or $NbO_x$) (layer 3) | 10-400 Å | 10-50 Å | 30 Å |
| $Si_xN_y$ (layer 4) | 50-450 Å | 90-200 Å | 113 Å |
| $ZnO_x$ (layer 7) | 10-300 Å | 40-150 Å | 100 Å |
| Ag (layer 9) | 50-250 Å | 80-120 Å | 95 Å |
| $NiCrO_x$ (layer 11) | 10-100 Å | 15-35 Å | 26 Å |
| $SnO_2$ (layer 13) | 0-1,000 Å | 350-800 Å | 483 Å |
| $Si_xN_y$ (layer 14) | 50-450 Å | 90-200 Å | 113 Å |
| $ZnO_x$ (layer 17) | 10-300 Å | 40-150 Å | 100 Å |
| Ag (layer 19) | 50-250 Å | 80-220 Å | 131 Å |
| $NiCrO_x$ (layer 21) | 10-100 Å | 15-35 Å | 26 Å |
| $SnO_2$ (layer 23) | 0-750 Å | 70-200 Å | 100 Å |
| $Si_3N_4$ (layer 25) | 0-750 Å | 120-320 Å | 226 Å |

In certain example embodiments of this invention, coated articles herein may have the following low-E (low emissivity) characteristics set forth in Table 3 when measured monolithically (before any optional HT). The sheet resistances ($R_s$) herein take into account all IR reflecting layers (e.g., silver layers 9, 19) in the coating, unless expressly stated to the contrary.

TABLE 3

Low-E/Solar Characteristics (Monolithic; pre-HT)

| Characteristic | General | More Preferred | Most Preferred |
|---|---|---|---|
| $R_s$ (ohms/sq.): | <=5.0 | <=3.5 | <=3.0 |
| $E_n$: | <=0.07 | <=0.04 | <=0.03 |
| $T_{vis}/R_s$: | >=20 | >=22 | >=25 |

In certain example embodiments, coated articles herein may have the following characteristics, measured monolithically for example, after HT:

TABLE 4

Low-E/Solar Characteristics (Monolithic, post-HT)

| Characteristic | General | More Preferred | Most Preferred |
|---|---|---|---|
| $R_s$ (ohms/sq.): | <=4.5 | <=3.0 | <=2.5 |
| $E_n$: | <=0.07 | <=0.04 | <=0.03 |
| $T_{vis}/R_s$: | >=30 | >=32 | >=34 (or >= 36) |

As explained above, the rather high values of the ratio $T_{vis}/R_s$ in Tables 3 and 4 are indicative of an excellent combination of high visible transmission and good solar performance (e.g., IR reflection). These high ratio values represent significant advantages over the prior art in certain example embodiments of this invention.

Moreover, coated articles including coatings 27 according to certain example embodiments of this invention have the following optical characteristics (e.g., when the coating(s) is provided on a clear soda lime silica glass substrate 1 from 1 to 10 mm thick) (HT or non-HT). In Table 5, all parameters are measured monolithically, unless stated to the contrary. In Table 5 below, $R_gY$ is visible reflection from the glass (g) side of the monolithic article, while $R_fY$ is visible reflection from the side of the monolithic article on which coating/film (f) (i.e., coating 27) is located. It is noted that the SHGC, SC, TS and ultraviolet transmission characteristics are in the context of an IG Unit (not monolithic like the rest of the data in Table 4), and the $\Delta E^*$ values are of course due to HT and thus taken after HT (e.g., heat strengthening, tempering, and/or heat bending).

TABLE 5

Optical Characteristics

| Characteristic | General | More Preferred |
|---|---|---|
| $T_{vis}$ (or TY)(Ill. C, 2 deg.): | >=65% | >=70% |
| $a^*_t$ (Ill. C, 2°): | −4.0 to +1.0 | −3.0 to 0.0 |
| $b^*_t$ (Ill. C, 2°): | −1.0 to +4.0 | 0.0 to 3.0 |
| $R_gY$ (Ill. C, 2 deg.): | 1 to 10% | 3 to 7% |
| $a^*_g$ (Ill. C, 2°): | −4.5 to +2.0 | −3.0 to 0.0 |
| $b^*_g$ (Ill. C, 2°): | −5.0 to +4.0 | −4.0 to +3.0 |
| $R_fY$ (Ill. C, 2 deg.): | 1 to 7% | 1 to 6% |
| $a^*_f$ (Ill. C, 2°): | −8.0 to 5.0 | −6.0 to 3.0 |
| $b^*_f$ (Ill. C, 2°): | −9.0 to 10.0 | −7.0 to 8.0 |
| $\Delta E^*_t$ (transmissive): | <=8.0 | <=5.0, 4.0, 3.0 or 2.5 |
| $\Delta E^*_g$ (glass side reflective): | <=8.0 | <=5.0, 4.0, 3.0 or 2.5 |
| $T_{ultraviolet}$ (IG): | <=40% | <=35% |
| SHGC (surface #2) (IG): | <=0.45 | <=0.40 |
| SC (#2) (IG): | <=0.49 | <=0.45 |
| TS% (IG): | <=40% | <=37% |
| Haze (post-HT): | <=0.4 | <=0.35 |

However, it is noted that in other example embodiments, the visible transmission may be lower (e.g., as low as 60%, or even 40-50% in certain instances).

The value(s) $\Delta E^*$ is important in determining whether or not there is matchability, or substantial color matchability upon HT, in the context of certain embodiments of this invention. Color herein is described by reference to the conventional a*, b* values. The term $\Delta a^*$ is simply indicative of how much color value a* changes due to HT (the same applies to $\Delta b^*$). If color changes too much upon HT (e.g., if $\Delta E^*$ is over 10), then the product may not be commercially acceptable. A very high value of $\Delta E^*$ may also be indicated of destruction of the Ag layer during HT, and/or of massive haze.

The term $\Delta E^*$ (and $\Delta E$) is well understood in the art and is reported, along with various techniques for determining it, in ASTM 2244-93 as well as being reported in Hunter et. al., *The Measurement of Appearance*, $2^{nd}$ Ed. Cptr. 9, page 162 et seq. (John Wiley & Sons, 1987). As used in the art, $\Delta E^*$ (and $\Delta E$) is a way of adequately expressing the change (or lack thereof) in reflectance and/or transmittance (and thus color appearance, as well) in an article after or due to HT. $\Delta E$ may be calculated by the "ab" technique, or by the Hunter technique (designated by employing a subscript "H"). AE corresponds to the Hunter Lab L, a, b scale (or $L_h$, $a_h$, $b_h$).

Similarly, $\Delta E^*$ corresponds to the CIE LAB Scale L*, a*, b*. Both are deemed useful, and equivalent for the purposes of this invention. For example, as reported in Hunter et. al. referenced above, the rectangular coordinate/scale technique (CIE LAB 1976) known as the L*, a*, b* scale may be used, wherein:

L* is (CIE 1976) lightness units
a* is (CIE 1976) red-green units
b* is (CIE 1976) yellow-blue units
and the distance $\Delta E^*$ between $L^*_o a^*_o b^*_o$ and $L^*_1 a^*_1 b^*_1$ is:

$$\Delta E^* = \{(\Delta L^*)^2 + (\Delta a^*)^2 + (\Delta b^*)^2\}^{1/2} \quad (1)$$

where:

$$\Delta L^* = L^*_1 - L^*_o \quad (2)$$

$$\Delta a^* = a^*_1 - a^*_o \quad (3)$$

$$\Delta b^* = b^*_1 - b^*_o \quad (4)$$

where the subscript "o" represents the coating (or coated article) before heat treatment and the subscript "1" represents the coating (coated article) after heat treatment; and the numbers employed (e.g., a*, b*, L*) are those calculated by the aforesaid (CIE LAB 1976) L*, a*, b* coordinate technique. In a similar manner, $\Delta E$ may be calculated using equation (1) by replacing a*, b*, L* with Hunter Lab values $a_h$, $b_h$, $L_h$. Also within the scope of this invention and the quantification of $\Delta E^*$ are the equivalent numbers if converted to those calculated by any other technique employing the same concept of $\Delta E^*$ as defined above.

As explained above, coated articles according to certain example embodiments of this invention may have a $\Delta E^*$ value (glass side reflective and/or transmissive) due to HT which is no greater than about 8.0, more preferably no greater than about 5.0, even more preferably no greater than about 4.0, even more preferably no greater than about 3.0, and sometimes no greater than about 2.5. These values are indicative of commercially acceptable heat treatable coated articles.

EXAMPLE 1

The following hypothetical examples are provided for purposes of example only, and are not intended to be limiting. The following examples included the listed layer stack set forth below, from the clear glass substrate outwardly.

TABLE 6

Layer Stack for Examples

| Layer | Thickness |
|---|---|
| Glass Substrate | about 3 to 3.4 mm |
| $SiO_xN_y$ | 40-100 Å |
| $TiO_x$ | 30-40 Å |
| $Si_xN_y$ | 113 Å |
| $ZnAlO_x$ | 100 Å |
| Ag | 95 Å |
| $NiCrO_x$ | 26 Å |
| $SnO_2$ | 483 Å |
| $Si_xN_y$ | 113 Å |
| $ZnAlO_x$ | 100 Å |

TABLE 6-continued

Layer Stack for Examples

| Layer | Thickness |
|---|---|
| Ag | 131 Å |
| NiCrO$_x$ | 26 Å |
| SnO$_2$ | 100 Å |
| Si$_3$N$_4$ | 226 Å |

Moreover, as explained herein, the bottom two silicon nitride layers (Si$_x$N$_y$) are preferably non-stoichiometric and Si-rich. As explained above, it has been found that the use of a combination of a Si-rich silicon nitride inclusive layer and a zinc oxide inclusive layer (e.g., ZnAlO$_x$) under a layer comprising silver allows the silver to be deposited in a manner which causes its sheet resistance to be lessened (which is desirable) compared to if other material(s) were under the silver. In certain example embodiments, the Si-rich silicon nitride inclusive (Si$_x$N$_y$) layer(s) allows the ratio T$_{vis}$/R$_s$ to be increased significantly after HT.

An example process which may be used in forming the coated article of hypothetical Example 1 is set forth in Ser. No. 10/400,080, incorporated herein by reference, except for the silicon oxynitride layer 2. The silicon oxynitride layer 2 may be formed so as to be about 60 Å thick using a silicon CMAG sputtering target (doped with Al). The oxygen and nitrogen gas flows used during sputtering may be adjusted so as to achieve a silicon oxynitride layer 2 having an index "n" of from 1.6 to 1.7. For example, and without limitation, see the table below:

TABLE 7

SPUTTER PROCESSING-EXAMPLE 1

| Cathode | Target | Power (kW) | Ar | O | N | λ Setting | Pressure |
|---|---|---|---|---|---|---|---|
| C11 | SiAl | 48 | 200 | 50 | 90 | n/a | 4.00 |
| C12 | Ti | 35.4 | 350 | 4.56 | 0 | n/a | 4.56 |
| C15 | SiAl | 52.2 | 250 | 0 | 305 | n/a | 4.38 |
| C24 | ZnAl | 43 | 250 | 556 | 0 | 175 | 5.07 |
| C32-a | Ag | 3.1 | 250 | 0 | 0 | 0 | 3.69 |
| C32-b | Ag | 3.2 | n/a | 0 | 0 | 0 | n/a |
| C33 | NiCr | 15.7 | 212 | 96 | 0 | 0 | 3.07 |
| C41 | Sn | 46.8 | 200 | 651 | 75 | 171.4 | 5.30 |
| C42 | Sn | 44.2 | 200 | 651 | 75 | 171.4 | 6.68 |
| C43 | Sn | 45.2 | 200 | 651 | 75 | 171.4 | 6.40 |

TABLE 7-continued

SPUTTER PROCESSING-EXAMPLE 1

| Cathode | Target | Power (kW) | Ar | O | N | λ Setting | Pressure |
|---|---|---|---|---|---|---|---|
| C44 | Sn | 49.9 | 200 | 651 | 75 | 171.4 | 6.69 |
| C45 | Sn | 39.8 | 200 | 651 | 75 | 171.4 | 5.17 |
| C52 | SiAl | 51.5 | 250 | 0 | 322 | n/a | 4.11 |
| C55 | ZnAl | n/a | 250 | 475 | 0 | 178 | 4.37 |
| C62-a | Ag | 4.5 | 250 | 0 | 0 | n/a | 3.43 |
| C62-b | Ag | 4.6 | n/a | 0 | 0 | n/a | n/a |
| C64 | NiCr | 14.8 | 250 | 93 | 0 | n/a | 4.23 |
| C71 | Sn | 41.9 | 200 | 765 | 75 | 172 | 5.29 |
| C73 | SiAl | 54.6 | 225 | 0 | 430 | n/a | 3.93 |
| C74 | SiAl | 53.3 | 225 | 0 | 430 | n/a | 5.86 |
| C75 | SiAl | 54.4 | 225 | 0 | 430 | n/a | 2.52 |

After being sputter deposited onto the glass substrate, Example 1 may have the following example characteristics after being subjected to HT at about 625 degrees C. for about 7.7 minutes:

TABLE 8

Characteristics of Example 1 (Monolithic - HT)

| Characteristic | Example 1 |
|---|---|
| Visible Trans. (T$_{vis}$ or TY) (Ill. C 2 deg.): | 81.04% |
| a* | -2.18 |
| b* | 0.93 |
| L* | 92.15 |
| ΔE*$_t$ | 4.54 |
| Glass Side Reflectance (RY) (Ill C, 2 deg.): | 5.20% |
| a* | 0.06 |
| b* | -2.06 |
| L* | 27.31 |
| ΔE*$_g$ | 2.44 |
| Film Side Reflective (FY) (Ill. C, 2 deg.): | 4.59 |
| a* | -3.45 |
| b* | 5.64 |
| L* | 25.54 |
| R$_s$ (ohms/square) (pre-HT): | 2.9 |
| R$_s$ (ohms/square) (post-HT): | 2.1 |
| T$_{vis}$/R$_s$ (post-HT): | 38.6 |

EXAMPLES 2-4

(Advantages of Si-rich)

Hypothetical examples 2-4 illustrate that the use of a Si-rich silicon nitride layer(s) (4 and/or 14). Again, the process used for hypothetical examples 2-4 is set forth in Ser. No. 10/400,080, except for the oxynitride.

TABLE 9

Results of Examples 2-4

| Ex. | R$_s$ (pre-HT) | T$_{vis}$ (pre-HT) | R$_s$ (HT1) | T$_{vis}$ (HT1) | R$_s$ (HT2) | T$_{vis}$ (HT2) | T$_{vis}$/R$_s$ |
|---|---|---|---|---|---|---|---|
| 2 (Si-rich) | 3.2 | 69.3 | 2.3 | 79.35 | 2.3 | 80.16 | 34.50 |
| 3 (Si-rich) | 3.2 | 69.5 | 2.3 | 79.69 | 2.3 | 79.00 | 34.64 |
| 4 (Si$_3$N$_4$) | 3.3 | 69.7 | 2.4 | 79.17 | 2.4 | 80.16 | 32.98 |

It can be seen from the above table that the Si-rich examples (Examples 2-3) for layer 4 were able to achieve lower sheet resistance values, and higher $T_{vis}/R_s$ ratios than the stoichiometric example (Example 4).

Figure 3:
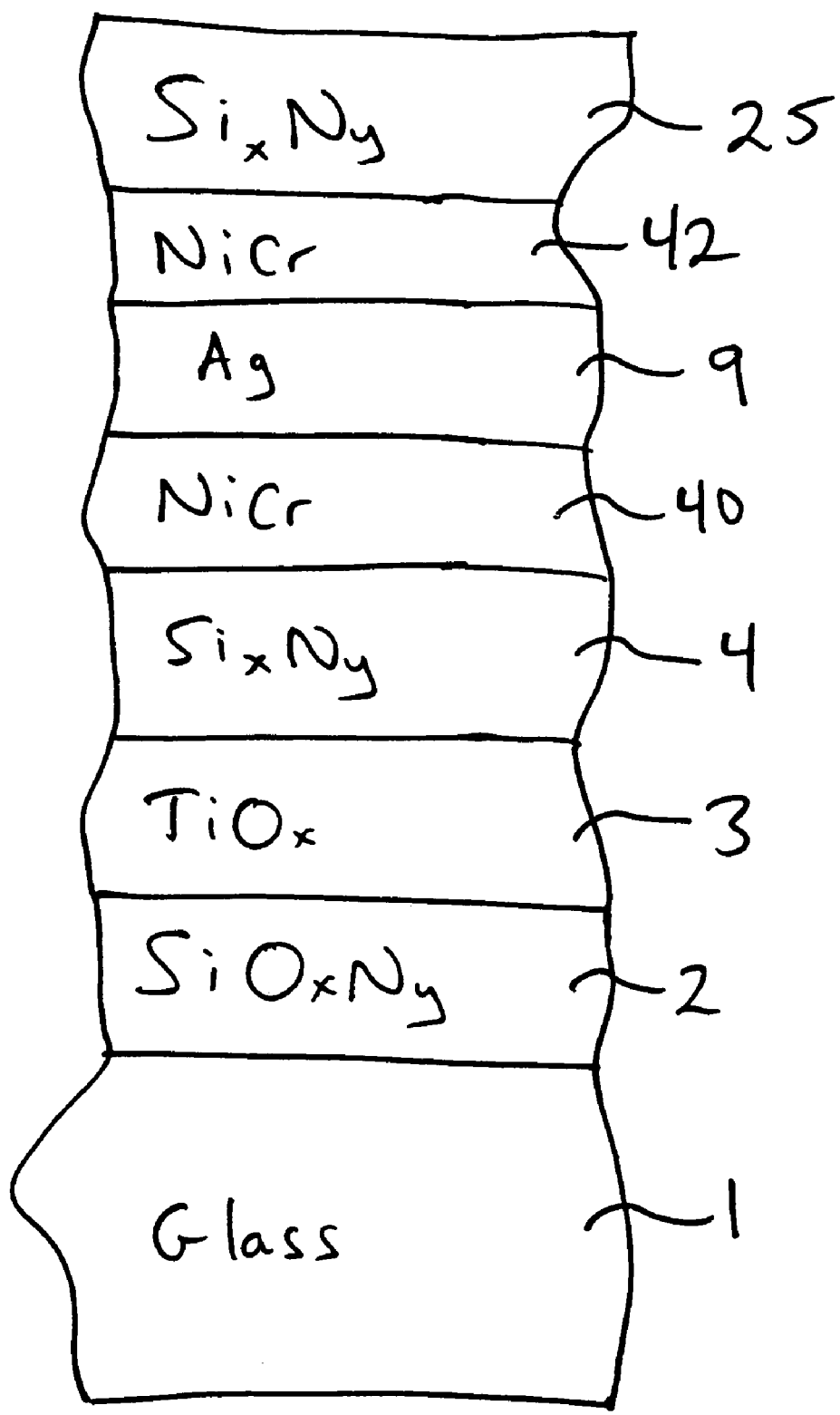
FIG. 3 is a cross sectional view of a coated article according to another example embodiment of this invention.
Figure 4:
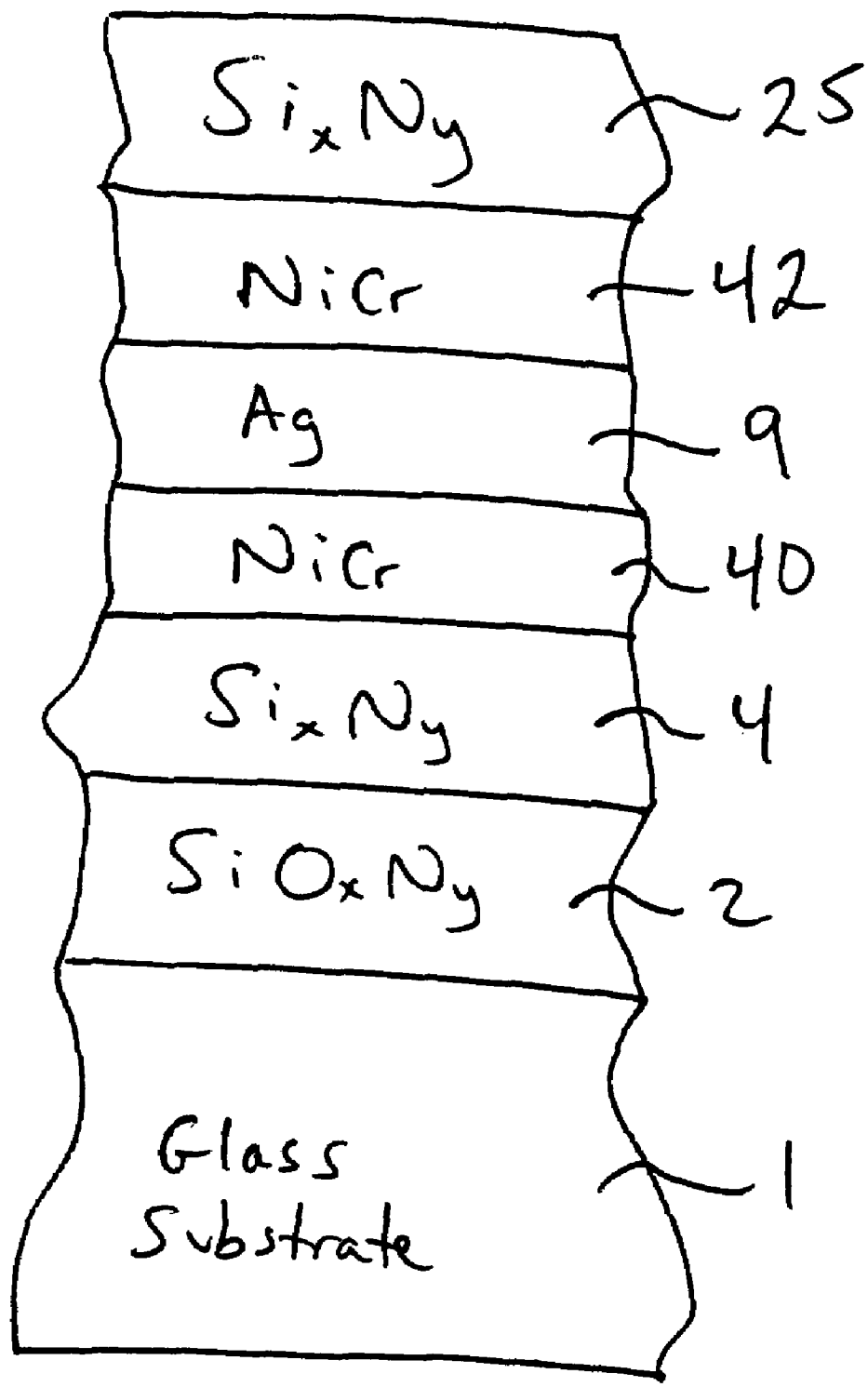
FIG. 4 is a cross sectional view of a coated article according to yet another example embodiment of this invention.

FIGS. 3-4 illustrate other example embodiments of this invention. In FIGS. 3-4, each of the coated articles includes only a single silver inclusive layer 9, as well as layer 2 comprising silicon oxynitrde. Moreover, the contact layers 40 and/or 42 may be of or include NiCr. The NiCr may be oxided or nitrided in certain instances. The FIG. 4 embodiment differs from the FIG. 3 embodiment in that the FIG. 4 embodiment does not include metal oxide layer 3 directly above the silicon oxynitrde layer 2. These coated articles may or may not be heat treated in different embodiments of this invention.

Any of the aforesaid monolithic coated articles may be used in an IG unit as shown in FIG. 2. Of course, when any of the above monolithic coated articles are coupled with another substrate(s) to form an IG unit, transmission will drop in the resulting IG unit. Thus, in certain example embodiments of this invention, IG units using coated articles herein may have a visible transmission of at least about 60%, more preferably of at least about 65%, and most preferably of at least about 68%.

Certain terms are prevalently used in the glass coating art, particularly when defining the properties and solar management characteristics of coated glass. Such terms are used herein in accordance with their well known meaning—see parent Ser. No. 10/400,080, incorporated herein by reference.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A coated article including a multi-layer coating supported by a glass substrate, the multi-layer coating comprising, from the glass substrate outwardly:
    a layer comprising silicon oxynitride located directly on and contacting the glass substrate;
    a layer comprising an oxide of titanium and/or niobium located directly on and contacting the layer comprising silicon oxynitride;
    a layer comprising zinc oxide located over the layers comprising silicon oxynitride and the oxide of titanium and/or niobium;
    a layer comprising silver located over and contacting the layer comprising zinc oxide;
    a dielectric layer comprising a metal oxide;
    another layer comprising silver; and
    another dielectric layer.

2. The coated article of claim 1, wherein the layer comprising silicon oxynitride has an index of refraction "n" of from 1.55 to 2.0.

3. The coated article of claim 1, wherein the coated article comprises a laminated vehicle windshield, and the layer comprising silicon oxynitride has an index of refraction "n" of from 1.85 to 2.0.

4. The coated article of claim 1, wherein the layer comprising silicon oxynitride has a thickness of from 40 to 200 Å.

5. The coated article of claim 1, wherein the coated article is heat treated and has a visible transmission of at least 65%, measured monolithically, after heat treatment.

6. The coated article of claim 1, wherein the coated article has a sheet resistance ($R_s$) of less than or equal to 4.0.

7. An IG window unit including the coated article of claim 1.

8. The coated article of claim 1, wherein the coated article is heat treated and is characterized by the following transmissive color at a normal viewing angle, after heat treatment:

| | |
|---|---|
| a* | −4.5 to +1.0 |
| b* | −1.0 to +4.0. |

9. The coated article of claim 1, wherein the layer comprising zinc oxide further includes aluminum or other metal(s).

10. The coated article of claim 1, wherein the layer comprising silicon oxynitride has an index of refraction of at least 1.6.

11. The coated article of claim 1, wherein the layer comprising silicon oxynitride further comprises aluminum and/or boron.

12. The coated article of claim 1, wherein the coated article is heat treated and has a ratio $T_{vis}/R_s$ of at least 25 after heat treatment (where $T_{vis}$ is visible transmission (%) and $R_s$ is sheet resistance of the coating in units of ohms/square) and ΔE* value (glass side reflective and/or transmissive) of less than or equal to about 8 due to the heat treatment.

13. The coated article of claim 12, wherein the coated article has a ratio $T_{vis}/R_s$ of at least 30 after heat treatment.

14. The coated article of claim 12, wherein the coated article has a ratio $T_{vis}/R_s$ of at least 32 after heat treatment.

15. The coated article of claim 12, wherein the coated article has a ratio $T_{vis}/R_s$ of at least 34 after heat treatment.

16. The coated article of claim 1, wherein the coated article is heat treated and has a ΔE* value (glass side reflective and/or transmissive) of less than or equal to about 5 due to the heat treatment.

17. The coated article of claim 16, wherein the coated article has a ΔE* value (glass side reflective and/or transmissive) of less than or equal to about 4 due to the heat treatment.

18. The coated article of claim 16, wherein the coated article has a ΔE* value (glass side reflective and/or transmissive) of less than or equal to about 3 due to the heat treatment.

19. The coated article of claim 16, wherein the coated article has a ΔE* value (glass side reflective and/or transmissive) of less than or equal to about 2.5 due to the heat treatment.

20. The coated article of claim 1, further comprising a layer comprising silicon nitride and/or silicon oxynitride located between the layer comprising the oxide of titanium and/or niobium and the layer comprising zinc oxide.

21. The coated article of claim 20, wherein said layer comprising silicon nitride is non-stoichiometric and is Si-rich.

22. The coated article of claim 21, wherein said layer comprising silicon nitride comprises $Si_xN_y$, where x/y is from 0.76 to 1.5.

23. The coated article of claim 21, wherein said layer comprising silicon nitride comprises $Si_xN_y$, where x/y is from 0.8 to 1.0.

24. A coated article including a multi-layer coating supported by a glass substrate, the multi-layer coating comprising, from the glass substrate outwardly:
- a layer comprising silicon oxynitride located directly on and contacting the glass substrate;
- a layer comprising a metal oxide located directly on and contacting the layer comprising silicon oxynitride;
- a layer comprising a nitride;
- a layer comprising zinc oxide;
- a layer comprising silver located over and contacting the layer comprising zinc oxide;
- a dielectric layer comprising a metal oxide;
- a layer comprising silicon nitride;
- another layer comprising zinc oxide;
- another layer comprising silver provided over and contacting said another layer comprising zinc oxide; and
- at least one further dielectric layer.

25. The coated article of claim 24, wherein the layer comprising silicon oxynitride has an index of refraction "n" of from 1.60 to 2.0.

26. The coated article of claim 24, wherein the layer comprising silicon oxynitride has an index of refraction "n" of at least 1.6, and a "k" value at 550 nm of from 0.01 to 0.03.

27. The coated article of claim 24, wherein the layer comprising silicon oxynitride further comprises aluminum and/or boron.

28. The coated article of claim 24, wherein the coated article is heat treated and has a ratio $T_{vis}/R_s$ of at least 30 after heat treatment (where $T_{vis}$ is visible transmission (%) and $R_s$ is sheet resistance of the coating in units of ohms/square) and a $\Delta E^*$ value (glass side reflective and/or transmissive) of less than or equal to about 8 due to the heat treatment.

29. The coated article of claim 28, wherein the coated article has a ratio $T_{vis}/R_s$ of at least 32 after heat treatment.

* * * * *